(12) United States Patent
Yamamoto

(10) Patent No.: US 11,152,908 B2
(45) Date of Patent: Oct. 19, 2021

(54) METHOD FOR MANUFACTURING PIEZOELECTRIC VIBRATION ELEMENT AND METHOD FOR MANUFACTURING PIEZOELECTRIC VIBRATOR

(71) Applicant: Murata Manufacturing Co., Ltd., Nagaokakyo (JP)

(72) Inventor: Hiroyuki Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 126 days.

(21) Appl. No.: 16/791,012

(22) Filed: Feb. 14, 2020

(65) Prior Publication Data
US 2020/0186116 A1 Jun. 11, 2020

Related U.S. Application Data

(63) Continuation of application No. PCT/JP2018/034711, filed on Sep. 20, 2018.

(30) Foreign Application Priority Data

Sep. 22, 2017 (JP) .............................. JP2017-182773

(51) Int. Cl.
*H03H 3/04* (2006.01)
*H03H 9/02* (2006.01)
(Continued)

(52) U.S. Cl.
CPC .......... *H03H 3/04* (2013.01); *H03H 9/02023* (2013.01); *H03H 9/0509* (2013.01);
(Continued)

(58) Field of Classification Search
CPC .... H03H 3/04; H03H 9/02023; H03H 9/1021; H03H 9/132; H03H 9/19; H03H 9/177; H03H 2003/022; H03H 2003/0428
See application file for complete search history.

(56) References Cited

U.S. PATENT DOCUMENTS 10,270,024 B2 4/2019 Kohda
2012/0235762 A1* 9/2012 Ii et al. .................. H03H 9/177
331/158

(Continued)

FOREIGN PATENT DOCUMENTS

JP H10308645 A 11/1998
JP 2005159717 A 6/2005

(Continued)

OTHER PUBLICATIONS

International Search Report issued for PCT/JP2018/034711, dated Nov. 27, 2018.

(Continued)

*Primary Examiner* — Jeffrey M Shin
(74) *Attorney, Agent, or Firm* — Arent Fox LLP

(57) ABSTRACT

A method for manufacturing a piezoelectric vibration element that includes preparing a piezoelectric substrate; providing a first electrode layer on a first main surface of the piezoelectric substrate; arranging a mask on a side of the first main surface of the piezoelectric substrate, the mask including a center region and a peripheral region located along a periphery of the center region; and irradiating a radiation beam through the mask toward the first main surface of the piezoelectric substrate such that a larger amount of the radiation beam passes through the peripheral region than the center region of the mask so as to remove a part of the first electrode layer to form a first excitation electrode that decreases in thickness from the center region to the peripheral region of the mask on the first main surface of the piezoelectric substrate.

20 Claims, 6 Drawing Sheets

(51) Int. Cl.
*H03H 9/05* (2006.01)
*H03H 9/10* (2006.01)
*H03H 9/13* (2006.01)
*H03H 9/19* (2006.01)
*H03H 3/02* (2006.01)

(52) U.S. Cl.
CPC .......... *H03H 9/1021* (2013.01); *H03H 9/132* (2013.01); *H03H 9/19* (2013.01); *H03H 2003/022* (2013.01); *H03H 2003/0428* (2013.01)

(56) References Cited

U.S. PATENT DOCUMENTS

| | | | |
|---|---|---|---|
| 2016/0260886 A1 | 9/2016 | Kohda | |
| 2018/0205364 A1* | 7/2018 | Kaga | H03H 9/132 |
| 2018/0375011 A1 | 12/2018 | Kohda | |

FOREIGN PATENT DOCUMENTS

| | | |
|---|---|---|
| JP | 200944237 A | 2/2009 |
| JP | 2015109633 A | 6/2015 |
| JP | 2017157934 A | 9/2017 |

OTHER PUBLICATIONS

Written Opinion of the International Searching Authority issued for PCT/JP2018/034711, dated Nov. 27, 2018.

* cited by examiner

METHOD FOR MANUFACTURING PIEZOELECTRIC VIBRATION ELEMENT AND METHOD FOR MANUFACTURING PIEZOELECTRIC VIBRATOR

CROSS REFERENCE TO RELATED APPLICATIONS

The present application is a continuation of International application No. PCT/JP2018/034711, filed Sep. 20, 2018, which claims priority to Japanese Patent Application No. 2017-182773, filed Sep. 22, 2017, the entire contents of each of which are incorporated herein by reference.

FIELD OF THE INVENTION

The present invention relates to a method for manufacturing a piezoelectric vibration element and a method for manufacturing a piezoelectric vibrator, and particularly relates to a method for forming an excitation electrode on a piezoelectric substrate.

BACKGROUND OF THE INVENTION

A piezoelectric vibrator, such as a quartz crystal resonator unit or the like, is widely known as an electronic component for generating a signal source of a clock reference signal. In such a piezoelectric vibrator, it is desirable to reduce the leakage of vibration energy, and to improve the confinement performance of the vibration.

Therefore, in order to solve the problem of occurrence of leakage of vibration energy, Patent Document 1 discloses a method in which, when an excitation electrode to be provided on a piezoelectric substrate is film-formed, an electrode material serving as the excitation electrode is deposited on the piezoelectric substrate through a special film formation mask pattern. With this, the excitation electrode is film-formed in a convex shape such that the thickness decreases from the center to the peripheral edge thereof.

Patent Document 1: Japanese Unexamined Patent Application Publication No. 2005-159717

SUMMARY OF THE INVENTION

However, in the method disclosed in Patent Document 1, the film formation process is special, a film formation rate is low and processing cost is high in some cases. Furthermore, since a frequency of a final product cannot be measured with high accuracy before the film formation of the excitation electrode, it is difficult to make a shape of the convex-shaped excitation electrode uniform for each product, and there is a possibility that variation in the quality of the final product arises.

The present invention has been made in view of the above-described circumstances, and an object of the present invention is to provide a method for manufacturing a piezoelectric vibration element and a method for manufacturing a piezoelectric vibrator through which quality can be stabilized with a simple configuration.

A method for manufacturing a piezoelectric vibration element according to an aspect of the present invention includes preparing a piezoelectric substrate having a first main surface and a second main surface opposing the first main surface; providing a first electrode layer on the first main surface of the piezoelectric substrate; arranging a mask on a side of the first main surface of the piezoelectric substrate, the mask including a center region and a peripheral region located along a periphery of the center region; and irradiating a radiation beam through the mask toward the first main surface of the piezoelectric substrate such that a larger amount of the radiation beam passes through the peripheral region than the center region of the mask so as to remove a part of the first electrode layer to form a first excitation electrode that decreases in thickness from the center region to the peripheral region of the mask on the first main surface of the piezoelectric substrate.

According to the present invention, an object is to provide a method for manufacturing a piezoelectric vibration element and a method for manufacturing a piezoelectric vibrator through which quality can be stabilized with a simple configuration.

DETAILED DESCRIPTION OF THE PREFERRED EMBODIMENTS

Figure 1:
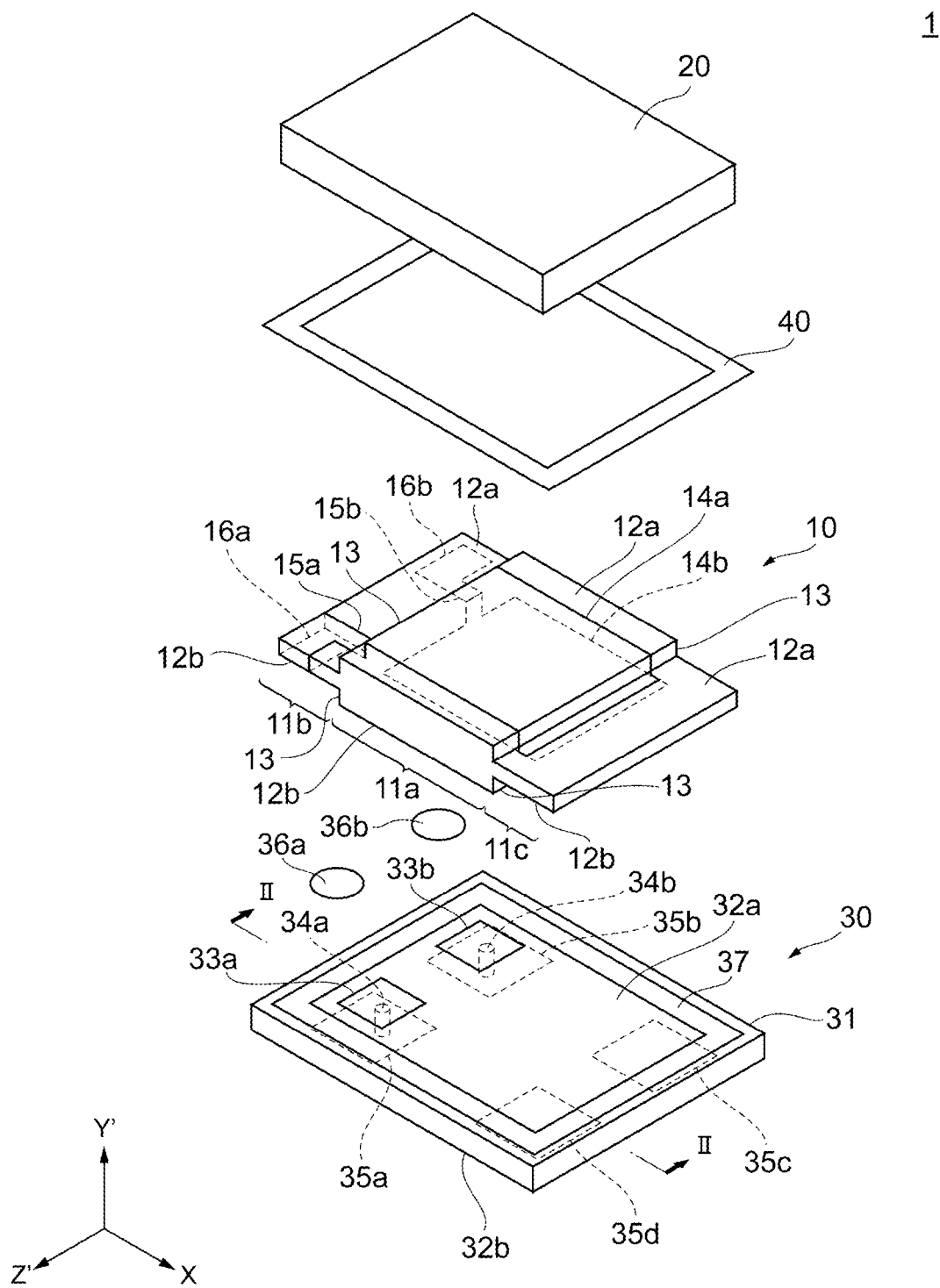
FIG. 1 is an exploded perspective view of a quartz crystal resonator unit according to the present embodiment.

An embodiment of the present invention will be described below. In the following description of the drawings, identical or similar constituent elements are denoted by identical or similar reference numerals. The drawings are illustrative, and the dimensions and shapes of parts are schematic and should not be construed as limiting the technical scope of the invention of the present application to the embodiment.

Figure 2:
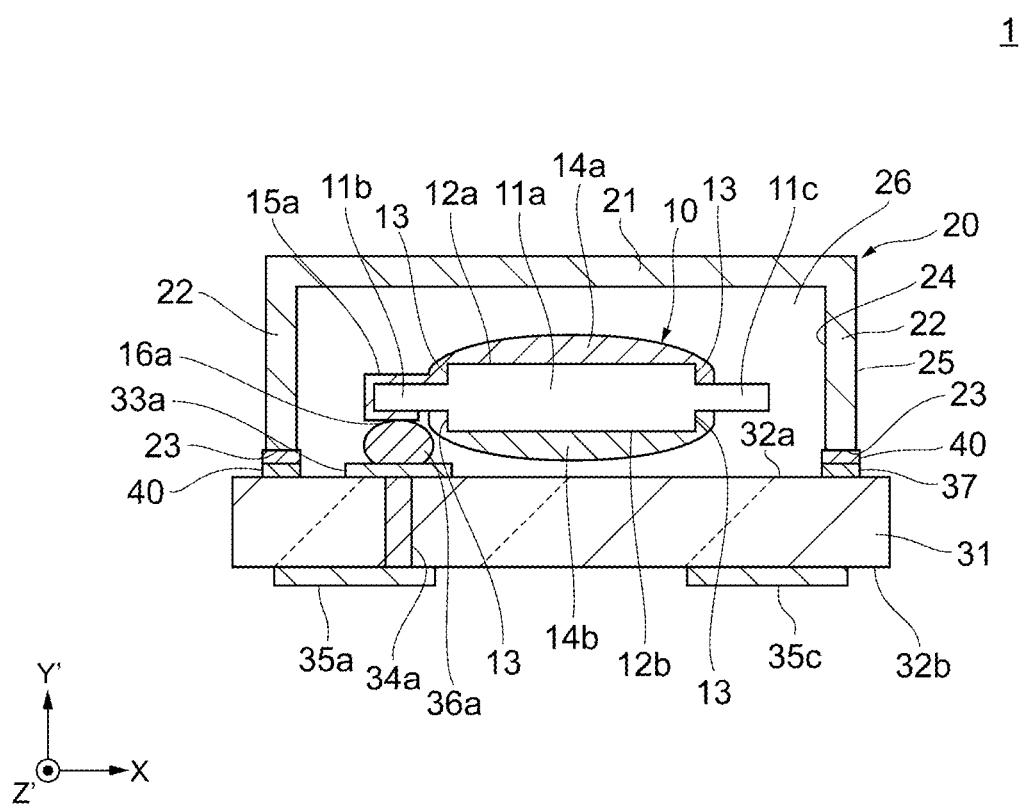
FIG. 2 is a cross-sectional view taken along a line II-II in FIG. 1.

Referring to FIG. 1 and FIG. 2, a quartz crystal resonator unit according to an embodiment of the present invention will be described. Hereinafter, a quartz crystal resonator unit will be described as an example of a piezoelectric vibrator.

Here, FIG. 1 is an exploded perspective view of a quartz crystal resonator unit according to a first embodiment of the present invention. FIG. 2 is a cross-sectional view taken along a line II-II in FIG. 1. Note that in FIG. 1, thicknesses of various electrodes are not illustrated.

As illustrated in FIG. 1, a quartz crystal resonator unit 1 according to the present embodiment includes a quartz crystal resonator 10, a lid member 20, and a base member 30. The quartz crystal resonator is an example of a piezoelectric vibration element. The lid member 20 and the base member 30 constitute a retainer for accommodating the quartz crystal resonator 10. Although the configuration of the lid member 20 and the base member 30 is not limited, in the example illustrated in FIG. 1, the lid member 20 is formed in a concave shape, and the base member 30 is formed in a flat plate shape.

The quartz crystal resonator 10 has a quartz crystal blank 11 of an AT-cut type. In a case where, among an X axis, a Y axis, and a Z axis, which are crystallographic axes of a synthetic quartz crystal, axes obtained by rotating the Y axis and the Z axis around the X axis in a direction from the Y axis to the Z axis by 35 degrees 15 minutes±1 minutes 30 seconds are taken as a Y' axis and a Z' axis, respectively, the AT-cut type quartz crystal blank 11 is obtained by cutting out a plane parallel to a plane specified by the X axis and the Z' axis (Hereinafter, referred to as an "XZ' plane". The same applies to a plane specified by other axes.) as a main surface. The quartz crystal blank 11 has a first main surface 12a and a second main surface 12b which are the XZ' planes opposing each other. The quartz crystal blank 11 is an example of a piezoelectric substrate.

The quartz crystal blank 11, which is an AT-cut quartz crystal blank, has a long side parallel to the X-axis direction, a short side parallel to the Z'-axis direction, and a side in a thickness direction parallel to the Y'-axis direction. Furthermore, the quartz crystal blank 11 is formed in a rectangular shape in the XZ' plane.

The quartz crystal resonator using the AT-cut quartz crystal blank has high frequency stability over a wide temperature range, is superior in characteristics of change with time, and furthermore can be manufactured with a simple configuration and low cost. In addition, in the AT-cut quartz crystal resonator, a thickness shear vibration mode is used as a main vibration.

In the present embodiment, when the first main surface 12a is viewed in a plan view from a normal direction, the quartz crystal blank 11 has a center portion 11a located on the center side of the first main surface 12a, and a peripheral edge portion 11b and a peripheral edge portion 11c each located on a peripheral edge side of the first main surface 12a. The center portion 11a is arranged between the peripheral edge portion 11b and the peripheral edge portion 11c, and is connected to each of the peripheral edge portion 11b and the peripheral edge portion 11c. The center portion 11a has, when viewed in a plan view from the normal direction of the first main surface 12a, a long side parallel to the X-axis direction and a short side parallel to the Z'-axis direction. Furthermore, of the peripheral edge portion 11b and the peripheral edge portion 11c, the one peripheral edge portion 11b is located on one side in the X-axis direction with respect to the center portion 11a, and the other peripheral edge portion 11c is located on the other side in the X-axis direction with respect to the center portion 11a. The peripheral edge portion 11b and the peripheral edge portion 11c correspond to peripheral edge portions of the quartz crystal blank 11, when the first main surface 12a is viewed in a plan view from the normal direction. The description of arrangement, shape, and the like of the center portion 11a, the peripheral edge portion 11b, and the peripheral edge portion 11c as described above similarly applies to a case where the second main surface 12b is viewed in a plan view from the normal direction.

In the present embodiment, the quartz crystal blank 11 has a mesa-type structure. Specifically, a thickness of the center portion 11a in the Y'-axis direction is thicker than a thickness of at least one of the peripheral edge portion 11b and the peripheral edge portion 11c in the Y'-axis direction. In other words, the center portion 11a is formed in a convex shape in which the center portion 11a protrudes more than the peripheral edge portion 11b and the peripheral edge portion 11c on the first main surface 12a side. This configuration similarly applies to the second main surface 12b side. The quartz crystal blank 11 is provided with side surfaces 13 at a boundary between the center portion 11a and the peripheral edge portion 11b, and at a boundary between the center portion 11a and the peripheral edge portion 11c, respectively. The side surface 13 as described above extends along the short side of the quartz crystal blank 11. In the example illustrated in FIG. 1, an angle formed by the side surface 13 and the XZ' plane is a right angle, but the angle is not particularly limited. For example, the angle formed by the side surface 13 and the XZ' plane may be a predetermined inclination angle depending on crystal orientation of the quartz crystal. The inclination angle as described above can be formed by wet etching, for example. Note that the thicknesses of the peripheral edge portion 11b and the peripheral edge portion 11c in the Y'-axis direction are the same.

The quartz crystal resonator 10 includes a first excitation electrode 14a and a second excitation electrode 14b which constitute a pair of electrodes. The first excitation electrode 14a is provided on the first main surface 12a of the center portion 11a. Furthermore, the second excitation electrode 14b is provided on the second main surface 12b of the center portion 11a. The first excitation electrode 14a and the second excitation electrode 14b oppose each other with the quartz crystal blank 11 (specifically, a portion including the center portion 11a) interposed therebetween. In other words, the first excitation electrode 14a and the second excitation electrode 14b are arranged so as to substantially overlap with each other as a whole at the XZ' plane.

Each of the first excitation electrode 14a and the second excitation electrode 14b has a long side parallel to the X-axis direction, a short side parallel to the Z'-axis direction, and a side in the thickness direction parallel to the Y'-axis direction. In the example illustrated in FIG. 1, in the XZ' plane, the long sides of the first excitation electrode 14a and the second excitation electrode 14b are parallel to the long side of the quartz crystal blank 11 (or the long side of the center portion 11a), and in the same manner, the short sides of the first excitation electrode 14a and the second excitation electrode 14b are parallel to the short side of the quartz crystal blank 11 (or the short side of the center portion 11a).

In the example illustrated in FIG. 1, the first excitation electrode 14a is arranged with a gap from each of the long sides of the center portion 11a. Moreover, the first excitation electrode 14a extends over the short side of the center portion 11a through the side surface 13 to the first main surface 12a of the peripheral edge portion 11b or the peripheral edge portion 11c. Such a configuration similarly applies to the second excitation electrode 14b.

As illustrated in FIG. 2, the first excitation electrode 14a decreases in thickness from the center to the peripheral edge of the center portion 11a on the first main surface 12a side of the center portion 11a. In the same manner, the second excitation electrode 14b decreases in thickness from the center to the peripheral edge of the center portion 11a on the second main surface 12b side of the center portion 11a. Such a thickness relationship is established in at least one direction, such as the direction along the long side of the quartz crystal blank 11 (or the center portion 11a) (see FIG. 2) or the like. In this case, for example, the first excitation electrode 14a and the second excitation electrode 14b may decrease in thickness from the center to the peripheral edge of the center portion 11a in the entire circumferential direction. Note that the expression "decrease in thickness from the center to the peripheral edge of the center portion 11a" is not limited to a state in which the all portions strictly decrease in thickness from the center to the peripheral edge, includes a state in which the thickness substantially decreases from the center to the peripheral edge, and includes, for example, a state in which the center of the center portion 11a is partially parallel to the XZ' plane and the thickness does not change, and a state in which a portion where the peripheral edge is slightly thicker than the center is partially included when microscopically viewed.

In this manner, by forming each of the first excitation electrode 14a and the second excitation electrode 14b in a convex shape so as to decrease in thickness from the center to the peripheral edge, vibration confinement performance of the quartz crystal resonator 10 can be improved. In particular, by applying the configuration described above to the quartz crystal blank 11 having a mesa-type structure, the vibration confinement performance can be further improved.

The quartz crystal resonator 10 includes extended electrodes 15a and 15b and electrode pads 16a and 16b. The electrode pad 16a is electrically connected to the first excitation electrode 14a through the extended electrode 15a. Furthermore, the electrode pad 16b is electrically connected to the second excitation electrode 14b through the extended electrode 15b. The electrode pad 16a and the electrode pad 16b are terminals for electrical connection to the base member 30. The electrode pad 16a and the electrode pad 16b are arrayed along the short side of the second main surface 12b, on the second main surface 12b of the one peripheral edge portion 11b of the quartz crystal blank 11.

The extended electrode 15a electrically connects the first excitation electrode 14a and the electrode pad 16a. Specifically, the extended electrode 15a is connected to the first excitation electrode 14a extending from the center portion 11a to the peripheral edge portion 11b through the side surface 13 on the first main surface 12a, extends from the first main surface 12a to the second main surface 12b through the side surface of the quartz crystal blank 11 at the peripheral edge portion 11b, and is connected to the electrode pad 16a of the peripheral edge portion 11b on the second main surface 12b.

The extended electrode 15b electrically connects the second excitation electrode 14b and the electrode pad 16b. Specifically, the extended electrode 15b is connected to the second excitation electrode 14b extending from the center portion 11a to the peripheral edge portion 11b through the side surface 13 on the second main surface 12b, and is electrically connected to the electrode pad 16b of the peripheral edge portion 11b on the second main surface 12b.

By causing the extended electrodes 15a and 15b to extend as described above, the first excitation electrode 14a and the second excitation electrode 14b provided on the two different main surfaces can be arranged on the second main surface 12b which is the one main surface by the electrode pads 16a and 16b, respectively.

The electrode pad 16a is electrically connected to an electrode of the base member 30 with a conductive holding member 36a interposed therebetween. Furthermore, the electrode pad 16b is electrically connected to an electrode of the base member 30 with a conductive holding member 36b interposed therebetween. The conductive holding members 36a and 36b are formed by thermally curing a conductive adhesive.

Although a material for each electrode of the first excitation electrode 14a and the second excitation electrode 14b, the extended electrodes 15a and 15b, and the electrode pads 16a and 16b is not particularly limited, for example, a chromium (Cr) layer may be included as a base, and a gold (Au) layer may further be included on the surface of the chromium layer.

The lid member 20 is bonded to the base member 30, thereby accommodating the quartz crystal resonator 10 in an internal space 26. The lid member 20 has an inner surface 24 and an outer surface 25, and is formed in a concave shape that opens toward a first main surface 32a of the base member 30.

The lid member 20 has a top surface portion 21 opposing the first main surface 32a of the base member 30, and a side wall portion 22 connected to an outer edge of the top surface portion 21 and extending in a normal direction with respect to the main surface of the top surface portion 21. The lid member 20 has a rectangular shape when viewed in a plan view from the normal direction of the main surface of the top surface portion 21. The top surface portion 21 of the lid member 20 has, for example, a long side parallel to the X-axis direction, a short side parallel to the Z'-axis direction, and a side in a thickness direction parallel to the Y'-axis direction. Furthermore, the lid member 20 has an opposing surface 23 opposing the first main surface 32a of the base member 30 at a concave-shaped opening edge, and the opposing surface 23 extends in a frame shape so as to surround the periphery of the quartz crystal resonator 10.

The lid member 20 is not particularly limited in a material, but is constituted of a conductive material such as a metal or the like, for example. This makes it possible to obtain a shielding function by the lid member 20. In this case, by grounding the lid member 20, which is a conductive material, the shielding function can be further improved. The lid member 20 includes, for example, an alloy containing iron (Fe) and nickel (Ni) (for example, 42 alloy). Furthermore, a gold (Au) layer or the like for preventing oxidation or the like may be provided on the outermost surface of the lid member 20. Alternatively, the lid member 20 may have a composite structure of an insulating material or a conductive material and an insulating material.

The base member 30 supports the quartz crystal resonator 10 so as to be able to excite it. Specifically, the quartz crystal resonator 10 is supported on the first main surface 32a of the base member 30 so as to be able to be excited, with the conductive holding members 36a and 36b interposed therebetween.

The base member 30 is formed in a flat plate shape. The base member 30 has a long side parallel to the X-axis direction, a short side parallel to the Z'-axis direction, and a side in a thickness direction parallel to the Y'-axis direction.

The base member 30 includes a base body 31. The base body 31 has the first main surface 32a and a second main surface 32b which are the XZ' planes opposing each other. The base body 31 is, for example, made of a sintered material of an insulating ceramic material (alumina) or the like. In this case, a plurality of insulating ceramic sheets may be laminated and sintered. Alternatively, the base body 31 may be formed of a glass material (for example, silicate glass, or a material including other than silicate as a main component, the material having a glass transition phenomenon by temperature rise), a quartz crystal material (for example, AT-cut quartz crystal), a glass epoxy resin, or the like. Preferably, the base body 31 is constituted of a heat-resistant material. The base body 31 may be constituted of a single layer or a plurality of layers, and in the case of the plurality of layers, includes an insulating layer formed as the outermost layer as the first main surface 32a.

The base member 30 includes connection electrodes 33a and 33b provided on the first main surface 32a, and outer electrodes 35a, 35b, 35c, and 35d provided on the second main surface. The connection electrodes 33a and 33b are terminals for electrical connection to the quartz crystal resonator 10. Furthermore, the outer electrodes 35a, 35b, 35c, and 35d are terminals for electrical connection to a mounting substrate, which is not illustrated. The connection electrode 33a is electrically connected to the outer electrode 35a with a via electrode 34a extending in the Y'-axis direction interposed therebetween, and the connection electrode 33b is electrically connected to the outer electrode 35b with a via electrode 34b extending in the Y'-axis direction interposed therebetween. The via electrodes 34a and 34b are each formed in a via hole passing through the base body 31 in the Y'-axis direction.

The connection electrodes 33a and 33b of the base member 30 are provided on the first main surface 32a in the vicinity of the short side on the negative side of the X-axis direction of the base member 30, and are arrayed away from the short side of the base member 30 and along the short side direction. The electrode pad 16a of the quartz crystal resonator 10 is connected to the connection electrode 33a with the conductive holding member 36a interposed therebetween, whereas the electrode pad 16b of the quartz crystal resonator 10 is connected to the connection electrode 33b with the conductive holding member 36b interposed therebetween.

The plurality of outer electrodes 35a, 35b, 35c, and 35d is provided at respective corner portions of the second main surface 32b. In the example illustrated in FIG. 1, the outer electrode 35a is arranged directly below the connection electrode 33a, and the outer electrode 35b is arranged directly below the connection electrode 33b. With this, the outer electrode 35a can be electrically connected to the connection electrode 33a by the via electrode 34a extending in the Y'-axis direction. Furthermore, the outer electrode 35b can be electrically connected to the connection electrode 33b by the via electrode 34b extending in the Y'-axis direction. In the example illustrated in FIG. 1, the outer electrodes 35a and 35b arranged in the vicinity of the short side on the negative side of the X-axis direction of the base member 30 among the four outer electrodes 35a to 35d are input/output electrodes to which an input/output signal of the quartz crystal resonator 10 is supplied. Furthermore, the outer electrodes 35c and 35d arranged in the vicinity of the short side on the positive side of the X-axis direction of the base member 30 are electrodes to which the input/output signal of the quartz crystal resonator 10 is not supplied. Also outer electrodes 35c and 35d are not supplied with input/output signals of other electronic elements on a mounting substrate, which is not illustrated, on which the quartz crystal resonator unit 1 is mounted. Alternatively, at least one of the outer electrodes 35c and 35d may be a ground electrode to which a ground potential is supplied. By connecting the lid member 20 to the outer electrode which is the ground electrode, a shielding effect of the lid member 20 can be improved.

A sealing frame 37 is provided on the first main surface 32a of the base body 31. The sealing frame 37 has a rectangular frame shape when viewed in a plan view from the normal direction of the first main surface 32a. The connection electrodes 33a and 33b are arranged inside the sealing frame 37. The sealing frame 37 is made of a conductive material. A bonding member 40 to be described later is provided on the sealing frame 37, whereby the lid member 20 is bonded to the base member 30 with the bonding member 40 and the sealing frame 37 therebetween.

The connection electrodes 33a and 33b, the outer electrodes 35a to 35d, and the sealing frame 37 of the base member 30 are each made of a metal film. For example, the connection electrodes 33a and 33b and the outer electrodes 35a to 35d are each configured by laminating a molybdenum (Mo) layer, a nickel (Ni) layer, and a gold (Au) layer from a lower layer to an upper layer. Furthermore, the sealing frame 37 may be constituted by a molybdenum (Mo) layer, or may be configured by laminating a molybdenum (Mo) layer, a nickel (Ni) layer, and a gold (Au) layer in the same manner as the connection electrode and the outer electrode. Furthermore, the via electrodes 34a and 34b can be formed by filling a via hole of the base body 31 with a metal material such as molybdenum or the like.

Note that the arrangement relationship of the connection electrodes 33a and 33b and the outer electrodes 35a to 35d is not limited to the above example. For example, the connection electrode 33a may be arranged in the vicinity of one short side of the base member 30, and the connection electrode 33b may be arranged in the vicinity of the other short side of the base member 30. In the configuration described above, the quartz crystal resonator 10 is held by the base member 30 at both end portions of the long side of the quartz crystal blank 11.

Furthermore, the arrangement of the outer electrode is not limited to the above example, and for example, two input/output electrodes may be provided on a diagonal of the second main surface 32b. Alternatively, the four outer electrodes may each be arranged in the vicinity of the center of each side instead of the corner portion of the second main surface 32b. Furthermore, the number of outer electrodes is not limited to four, and, for example, only two input/output electrodes may be provided. Furthermore, the electrical connection configuration between the connection electrode and the outer electrode is not limited to the configuration by the via electrode, and the electrical conduction may be achieved by the extended electrode being extended onto the first main surface 32a or the second main surface 32b. Alternatively, by forming the base body 31 of the base member 30 with a plurality of layers, causing the via electrode to extend to an intermediate layer, and an inner electrode being extended in the intermediate layer, the electrical connection between the connection electrode and the outer electrode may be achieved.

As illustrated in FIG. 2, both of the lid member 20 and the base member 30 are bonded to each other with the sealing frame 37 and the bonding member 40 interposed therebetween, whereby the quartz crystal resonator 10 is sealed in the internal space (cavity) 26 surrounded by the lid member 20 and the base member 30.

The bonding member 40 is provided over the entire circumference of the lid member 20 and the base member 30. Specifically, the bonding member 40 is provided on the sealing frame 37. By interposing the sealing frame 37 and the bonding member 40 between the opposing surface 23 of the side wall portion 22 of the lid member 20 and the first main surface 32a of the base member 30, the quartz crystal resonator 10 is sealed in by the lid member 20 and the base member 30.

The bonding member 40 is, for example, a brazing member. Specifically, the bonding member 40 is made of a gold (Au)-tin (Sn) eutectic alloy. In this manner, the lid member 20 and the base member 30 are metal-bonded. By being metal-bonded, a sealing property can be improved. Note that the bonding member 40 is not limited to a conductive material, and may be, for example, a glass adhesive material such as low melting point glass (for example, lead boric acid-based, tin phosphoric acid-based, or the like) or the like, or an insulating material such as a resin adhesive or the like. With this, the cost is reduced in comparison with that of metal bonding, heating temperature can be reduced, and a manufacturing process can be simplified.

In the quartz crystal resonator 10 according to the present embodiment, one end (an end portion on the side where the conductive holding members 36a and 36b are arranged) of the long side of the quartz crystal blank 11 is a fixed end, and the other end thereof is a free end. Furthermore, the quartz crystal resonator 10, the lid member 20, and the base member 30 are each formed in a rectangular shape in the XZ' plane, and respective directions of the long sides and short sides thereof coincide with one another.

Note that the fixed end position of the quartz crystal resonator 10 is not particularly limited, and as a modification, the quartz crystal resonator 10 may be fixed to the base member 30 at both ends of the long side of the quartz crystal blank 11. In this case, each electrode of the quartz crystal resonator 10 and the base member 30 may be formed in a configuration in which the quartz crystal resonator 10 is fixed at both the ends of the long side of the quartz crystal blank 11.

In the quartz crystal resonator unit 1 according to the present embodiment, an alternating electric field is applied between the pair of first and second excitation electrodes 14a and 14b in the quartz crystal resonator 10 through the outer electrodes 35a and 35b of the base member 30. With this, the center portion 11a of the quartz crystal blank 11 vibrates by a predetermined vibration mode such as a thickness shear vibration mode or the like, and resonance characteristics associated with the vibration are obtained.

Figure 3:
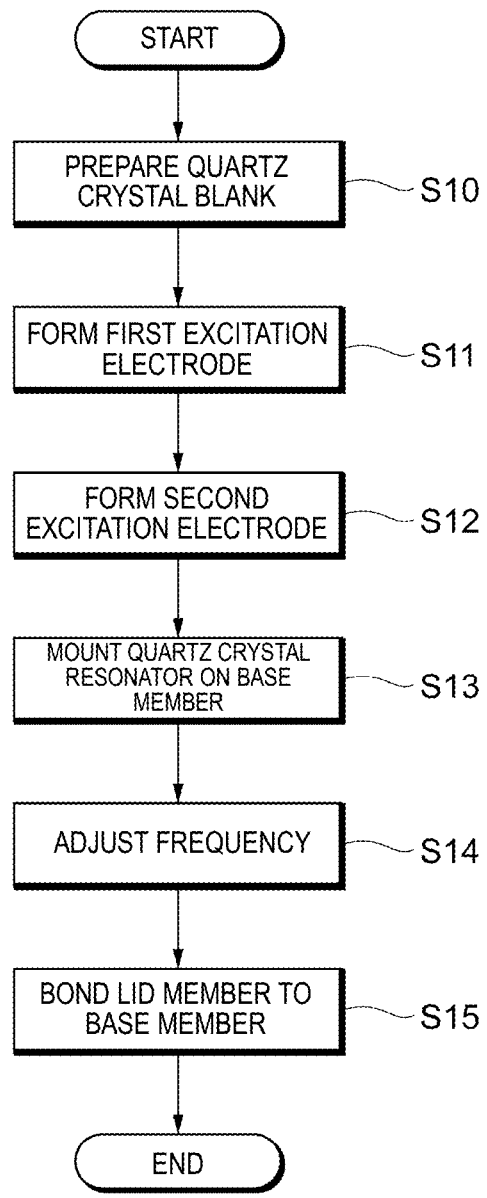
FIG. 3 is a flowchart illustrating a method for manufacturing the quartz crystal resonator unit according to the present embodiment.

Next, referring to FIG. 3 to FIG. 8, a method for manufacturing the quartz crystal resonator unit according to the embodiment of the present invention will be described. In the present embodiment, as an example, a method for manufacturing the quartz crystal resonator unit 1 will be described. FIG. 3 is a flowchart, FIG. 4 to FIG. 7 are each a diagram for explaining steps S11 and S12 in FIG. 3 in detail. FIG. 8 is a plan view of a mask used in FIG. 6.

The present embodiment includes forming each of the first excitation electrode 14a and the second excitation electrode 14b such that the thickness decreases from the center to the peripheral edge of the center portion 11a of the quartz crystal blank 11. This will be specifically described below.

First, the quartz crystal blank 11 is prepared (S10). In the present embodiment, the quartz crystal blank 11 is formed so as to have the center portion 11a, and the peripheral edge portion 11b and the peripheral edge portion 11c each having a thickness smaller than that of the center portion 11a. The quartz crystal blank 11 can be formed by using wet etching, dry etching, or the like.

Next, the first excitation electrode 14a is formed on the first main surface 12a of the quartz crystal blank 11 (S11), and the second excitation electrode 14b is formed on the second main surface 12b of the quartz crystal blank 11 (S12). In the present embodiment, a manufacturing process of the first excitation electrode 14a and a manufacturing process of the second excitation electrode 14b are both performed. The manufacturing process of the second excitation electrode 14b is the same as the manufacturing process of the first excitation electrode 14a. Therefore, in the following description, the manufacturing process of the first excitation electrode 14a will be mainly described with reference to FIG. 4 to FIG. 7.

Figure 4:
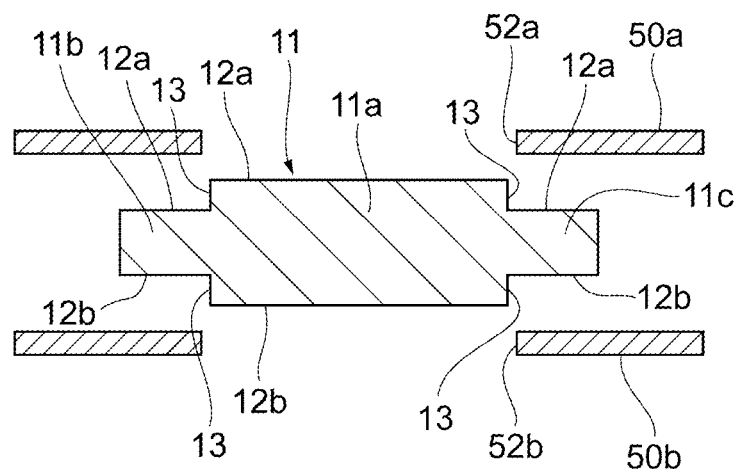
FIG. 4 is a diagram for explaining steps S11 and S12 in FIG. 3 in detail.
Figure 5:
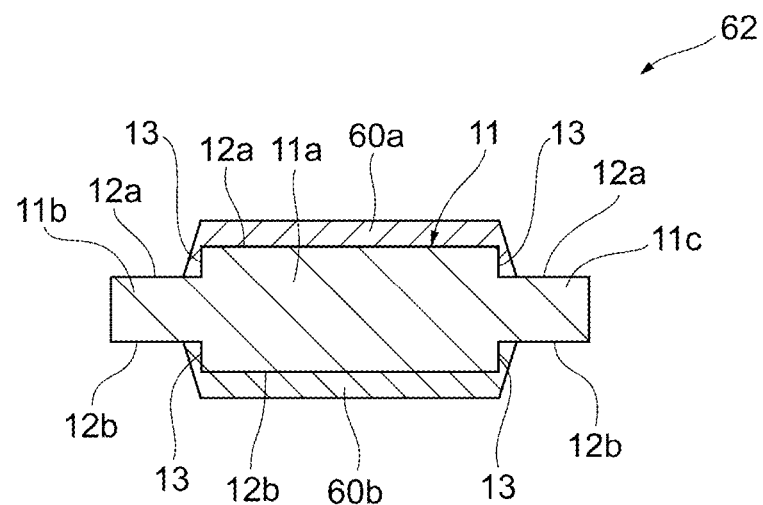
FIG. 5 is a diagram for explaining steps S11 and S12 in FIG. 3 in detail.

First, as illustrated in FIG. 4, a mask 50a is arranged on the first main surface 12a side of the quartz crystal blank 11. The mask 50a has an opening 52a for film-forming with an electrode material on the first main surface 12a. In the example illustrated in FIG. 4, an opening region of the opening 52a is slightly larger than a region of the center portion 11a. This makes it possible to provide a first electrode layer in a region including the first main surface 12a of the center portion 11a and reaching the first main surface 12a of the peripheral edge portion 11b and the peripheral edge portion 11c through the side surface 13.

In the same manner, a mask 50b is arranged on the second main surface 12b side of the quartz crystal blank 11. The mask 50b has an opening 52b, and the contents described in the mask 50a can be applied to configurations thereof.

Next, by film-forming with an electrode material through the mask 50a, a first electrode layer 60a is provided. The first electrode layer 60a is provided so as to include the first main surface 12a of the center portion 11a and to reach the first main surface 12a of the peripheral edge portion 11b and the peripheral edge portion 11c through the side surface 13. The first electrode layer 60a has a uniform thickness on the first main surface 12a at the center portion 11a. Here, the expression "uniform thickness" means that not only a state in which the thickness is exactly the same but also a state in which the thickness is substantially the same are included. In the example illustrated in FIG. 5, the first electrode layer 60a has a uniform thickness in a region slightly smaller than the region of the first main surface 12a of the center portion 11a. The first electrode layer 60a gradually decreases in thickness in a direction away from the center of the opening of the mask 50a, at an outer edge of the opening 52a of the mask 50a, that is, at the vicinity of the side surface 13 between the center portion 11a and each of the peripheral edge portion 11b and the peripheral edge portion 11c.

In the same manner, by film-forming with an electrode material through the mask 50b, a second electrode layer 60b is provided. Note that the first electrode layer 60a and the second electrode layer 60b may be film-formed at the same time, or after one electrode layer is film-formed, the other electrode layer may be film-formed.

As described above, a quartz crystal resonator 62 including the quartz crystal blank 11, the first electrode layer 60a provided on the first main surface 12a of the quartz crystal blank 11, and the second electrode layer 60b provided on the second main surface 12b of the quartz crystal blank 11 can be manufactured. Each of the first electrode layer 60a and the second electrode layer 60b has a uniform thickness.

Figure 6:
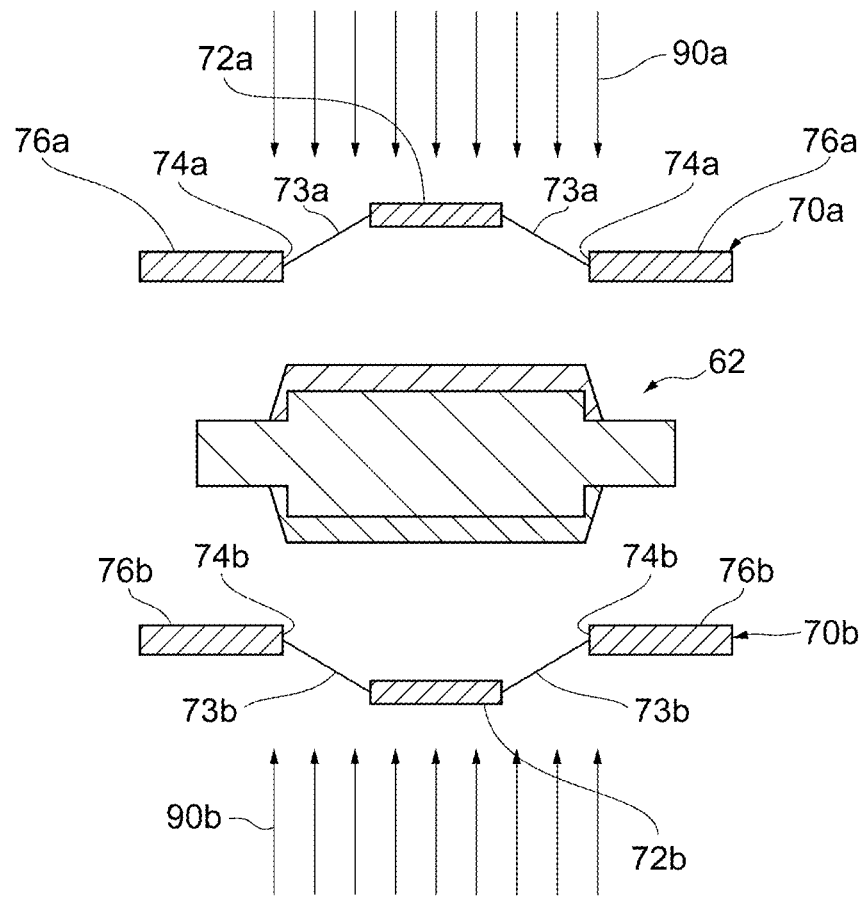
FIG. 6 is a diagram for explaining steps S11 and S12 in FIG. 3 in detail.

Next, as illustrated in FIG. 6, a mask 70a is arranged on the first main surface 12a side of the quartz crystal blank 11, and irradiation with an ion beam 90a is performed from the first main surface 12a side through the mask 70a. In this way, the electrode material of the first electrode layer 60a is partially removed depending on an ion beam amount of the ion beam 90a with which the first electrode layer 60a is irradiated, and the first electrode layer 60a is formed in a predetermined shape.

The mask 70a according to the present embodiment includes a center region 72a, a peripheral region 74a located in the periphery of the center region 72a, and a shielding region 76a located in the periphery of the peripheral region 74a (see FIG. 8). The shielding region 76a substantially blocks the ion beam 90a. The peripheral region 74a is configured such that the ion beam amount of the ion beam 90a passing therethrough becomes larger than that of the center region 72a. As an example, the peripheral region 74a is an opening through which the ion beam 90a passes. In the example of the mask of FIG. 8, the center region 72a blocks the ion beam 90a in the same manner as the shielding region 76a. The center region 72a is connected to the shielding region 76a by a support region 73a. As an example, each corner portion of the rectangular center region 72a is connected to the shielding region 76a by the support region 73a.

In the example illustrated in FIG. 6, when the mask 70a is arranged on the first main surface 12a side of the quartz crystal blank 11, the center region 72a is arranged in a portion including the center of the center portion 11a, and the outer edge of the peripheral region 74a is located in a slightly outer side portion than the region of the center portion 11a. Furthermore, the center region 72a is located in a direction away from the first main surface 12a of the quartz crystal blank 11 in comparison with the shielding region 76a. A shape of the center region 72a in a plan view is a square shape in the example illustrated in FIG. 8, but is not limited thereto, may be a circular shape, an elliptical shape, or a rectangular shape, or may be a shape similar to those.

In the same manner, a mask 70b is arranged on the second main surface 12b side of the quartz crystal blank 11, and irradiation with an ion beam 90b is performed from the second main surface 12b side through the mask 70b. In this way, the electrode material of the second electrode layer 60b is partially removed depending on an ion beam amount of the ion beam 90b with which the second electrode layer 60b is irradiated, and the second electrode layer 60b is formed in a predetermined shape. Note that the mask 70b includes, in the same manner as the mask 70a, a center region 72b, a peripheral region 74b located in the periphery of the center region 72b, and a shielding region 76b located in the periphery of the peripheral region 74b. The contents described in the mask 70a can be applied to the configuration of the mask 70b.

The step of irradiating with the ion beam 90b from the second main surface 12b side of the quartz crystal blank 11 can be performed at least partially simultaneously with the step of irradiating with the ion beam 90a from the first main surface 12a side of the quartz crystal blank 11.

Alternatively, timing of both the irradiation steps is not limited to this, and after one irradiation step, the other irradiation step may be performed. For example, irradiation with the ion beam may be performed from only one direction, then front and back surfaces of the quartz crystal blank 11 may be inverted, and the first main surface 12a and the second main surface 12b may be sequentially processed. In this case, since, by performing the irradiation with the ion beam from the direction opposite to the gravity and processing, the electrode material scraped off by the irradiation with the ion beam falls due to the gravity, particles of the electrode material can be suppressed from adhering to the quartz crystal blank 11.

At least one of the step of irradiating with the ion beam 90a from the first main surface 12a side of the quartz crystal blank 11 and the step of irradiating with the ion beam 90b from the second main surface 12b side of the quartz crystal blank 11 includes adjusting a frequency. For example, the frequency of the quartz crystal resonator 62 in a state in which the first electrode layer 60a and the second electrode layer 60b are provided before the irradiation with the ion beams 90a and 90b is measured, irradiation conditions of the ion beams 90a and 90b are controlled based on the measured value, and the first excitation electrode 14a and the second excitation electrode 14b are formed. In this case, by performing the irradiation with the ion beams 90a and 90b while measuring the frequency, the thicknesses of the first excitation electrode 14a and the second excitation electrode 14b can be controlled.

Figure 7:
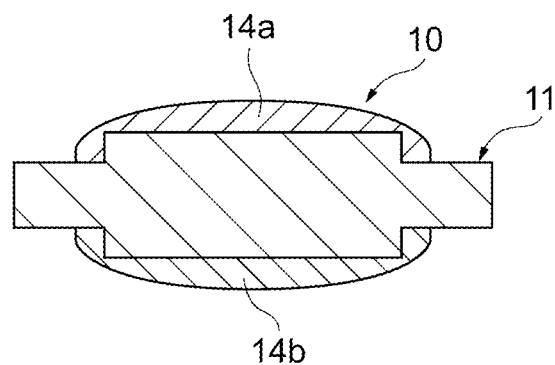
FIG. 7 is a diagram for explaining steps S11 and S12 in FIG. 3 in detail.
Figure 8:
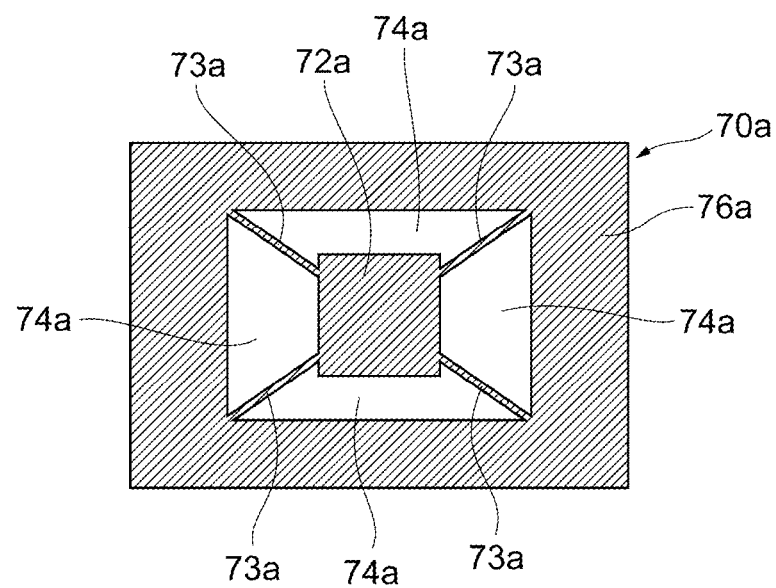
FIG. 8 is a plan view of a mask used in FIG. 6.

Thereafter, the various electrodes described above are formed on the quartz crystal blank 11, and as illustrated in FIG. 7, the quartz crystal resonator 10 including the quartz crystal blank 11, the first excitation electrode 14a, and the second excitation electrode 14b can be manufactured. As described above, the first excitation electrode 14a is formed so as to decrease in the thickness from the center to the peripheral edge of the center portion 11a of the quartz crystal blank 11 on the first main surface 12a side, and the second excitation electrode 14b is formed so as to decrease in thickness from the center to the peripheral edge of the center portion 11a of the quartz crystal blank 11 on the second main surface 12b side.

Returning to FIG. 3, next, the quartz crystal resonator 10 is mounted on the base member 30 (S13). Specifically, a conductive adhesive is applied on the connection electrodes 33a and 33b on the first main surface 32a of the base body 31, and the conductive adhesive is thermally cured in a state in which the quartz crystal resonator 10 is mounted. In this way, the electrode pad 16a of the quartz crystal resonator 10 and the connection electrode 33a of the base member 30 are electrically connected by the conductive holding member 36a obtained by thermally curing the conductive adhesive, and the electrode pad 16b of the quartz crystal resonator 10 and the connection electrode 33b of the base member 30 are electrically connected by the conductive holding member 36b obtained by thermally curing the conductive adhesive. Furthermore, the quartz crystal resonator 10 can be held by the conductive holding members 36a and 36b so as to be able to be excited. Note that the quartz crystal resonator 10 is mounted on the first main surface 32a such that the second excitation electrode 14b faces toward the base member 30 side.

After that, the frequency is adjusted for the quartz crystal resonator 10, as necessary (S14). For example, by irradiation with an ion beam under a reduced pressure state and by removing a part of the first excitation electrode 14a, the thickness of the first excitation electrode 14a is reduced and adjustment to a desired frequency is performed.

The entire quartz crystal resonator 10 can be irradiated with the ion beam for the frequency adjustment from the first main surface 12a side of the quartz crystal blank 11. This makes it possible to remove particles, such as a work residue formed by the quartz crystal, the electrode, or the resin resist, dust in the atmosphere, and the like, adhering to the surface of the quartz crystal resonator 10. Note that it is not necessary to irradiate the entire quartz crystal resonator 10 with the ion beam for the frequency adjustment, for example, at least a partial region of the first excitation electrode 14a may be irradiated from the first main surface 12a side. As described above, by irradiating at least the partial region of the first excitation electrode 14a required for the frequency adjustment with the ion beam, the frequency adjustment can be efficiently performed.

Finally, the lid member 20 is bonded to the base member 30 (S15). Specifically, the bonding member 40 is provided on the sealing frame 37 of the base member 30, and the sealing frame 37 and the bonding member 40 are interposed between the opposing surface 23 of the side wall portion 22 of the lid member 20 and the first main surface 32a of the base member 30. In this manner, the quartz crystal resonator unit 1 in which the quartz crystal resonator 10 is accommodated in the internal space 26 by the lid member 20 and the base member 30 can be manufactured.

As described above, according to the present embodiment, the irradiation with the ion beam 90a is performed using the mask 70a, and the first excitation electrode 14a with a thickness decreasing from the center region 72a to the peripheral region 74a of the mask 70a is formed. Accordingly, compared to a case where a convex-shaped excitation electrode is formed by a special film formation process, it is possible to achieve a manufacturing process which is simpler and lower in cost and in which variations in quality are suppressed.

The present invention is not limited to the above embodiment, and can be applied with modifications in various ways.

Figure 9:
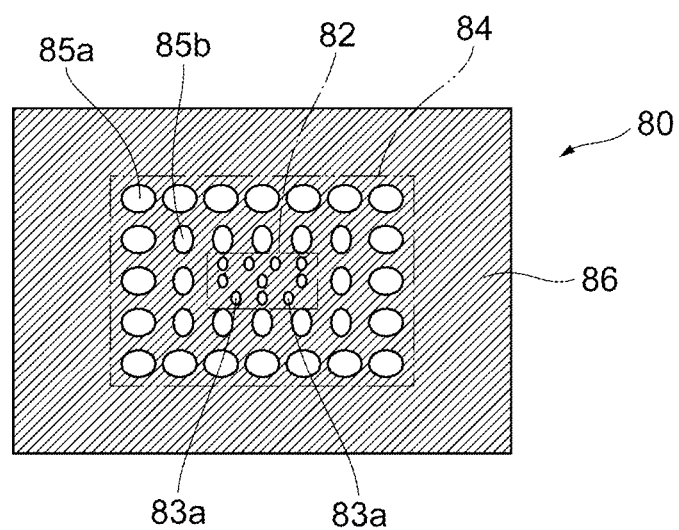
FIG. 9 is a plan view of a mask according to a modification of the present embodiment.

FIG. 9 is a plan view of a mask according to a modification of the present embodiment, and illustrating another aspect of a mask used at the time of irradiation with an ion beam.

A mask 80 illustrated in FIG. 9 includes a center region 82, a peripheral region 84 located in the periphery of the center region 82, and a shielding region 86 located in the periphery of the peripheral region 84. In each of the center region 82 and the peripheral region 84, one or more openings through which the ion beam passes are formed. In the example illustrated in FIG. 9, a plurality of openings 83a is provided in the center region 82, and a plurality of openings 85a and openings 85b each having an opening size larger than that of any opening 83a in the center region 82 is provided in the peripheral region 84. In the peripheral region 84, the plurality of openings 85a is provided at a position farther from the center region 82 than the plurality of openings 85b, and the opening 85a has an opening size larger than that of the opening 85b. In this manner, in the mask 80, the opening size is gradually increased from the center region 82 to the peripheral region 84.

Note that in the example illustrated in FIG. 9, although the one or more openings 83a are provided in the center region 82, as another modification, the center region 82 may not be provided with an opening, and the entire region thereof may be a shielding region.

In the above embodiment, although the convex-shaped configuration in which the center portion 11a protrudes more than the peripheral edge portion 11b and the peripheral edge portion 11c on both the main surfaces of the quartz crystal blank 11 has been described, the convex-shaped configuration as described above may be applied for only one of the first main surface 12a and the second main surface 12b. For example, the center portion 11a may be formed in a convex shape protruding more than the peripheral edge portion 11b and the peripheral edge portion 11c only on the first main surface 12a side, and the center portion 11a, the peripheral edge portion 11b, and the peripheral edge portion 11c may be flush with one another on the second main surface 12b. In this case, at least the first excitation electrode 14a on the first main surface 12a side may be decreased in thickness from the center to the peripheral edge of the center portion 11a. In the configuration described above as well, it is possible to improve the vibration confinement performance.

Although the aspect of the quartz crystal blank 11 having the mesa-type structure has been described in the above embodiment, a quartz crystal blank having a flat-type structure may also be used. In this case, at least the first excitation electrode 14a on the first main surface 12a side may be decreased in thickness from the center to the peripheral edge of the center portion 11a. In the configuration described above as well, it is possible to improve the vibration confinement performance.

In the above embodiment, although the example in which the step (S14) of adjusting the frequency is performed after mounting the quartz crystal resonator 10 on the base member 30 has been described, the step (S14) may be omitted. That is, the frequency adjustment may be completed in the steps (S11 and S12) of forming the first excitation electrode 14a and the second excitation electrode 14b.

In the above embodiment, although the aspect of an ion milling using the ion beam as the example of the radiation beam has been described, another radiation beam for scraping the electrode material may also be used without limiting to the ion milling described above. For example, plasma CVM (Chemical Vaporization Machining) or the like may be applied instead of the ion milling.

In the above embodiment, although the base member is a flat plate and the lid member has the concave shape, in the present invention, the shapes of the base member and the lid member are not particularly limited as long as the quartz crystal resonator can be accommodated in the internal space, and for example, the base member may have a concave shape and the lid member may have a flat plate shape.

Furthermore, a different cut (for example, BT-cut or the like) other than the AT-cut may be applied to the quartz crystal blank. Additionally, the configuration of the present invention may be applied to a piezoelectric vibration element using a piezoelectric substrate made of another piezoelectric body other than the quartz crystal.

Note that each embodiment described above is to facilitate understanding of the present invention, and is not intended to limit the interpretation on the present invention. The present invention can be modified/improved without departing from the essential spirit thereof, and the equivalents are also included in the present invention. In other words, each embodiment to which design changes are added as desired by those skilled in the art also falls within the scope of the present invention as long as the features of the present invention are provided. For example, the elements provided in each embodiment, and the arrangements, materials, conditions, shapes, sizes, and the like thereof, are not limited to the examples given here, and can be changed as desired. Additionally, the elements provided in each embodiment can be combined as long as doing so is feasible from a technical standpoint, and such combinations also fall within the scope of the present invention as long as the features of the present invention are provided.

REFERENCE SIGNS LIST

1 QUARTZ CRYSTAL RESONATOR UNIT
10 QUARTZ CRYSTAL RESONATOR
11 QUARTZ CRYSTAL BLANK
11a CENTER PORTION
11b PERIPHERAL EDGE PORTION
11c PERIPHERAL EDGE PORTION
12a FIRST MAIN SURFACE
12b SECOND MAIN SURFACE
13 SIDE SURFACE
14a FIRST EXCITATION ELECTRODE
14b SECOND EXCITATION ELECTRODE
20 LID MEMBER
30 BASE MEMBER
60a FIRST ELECTRODE LAYER
60b SECOND ELECTRODE LAYER
70a MASK
70b MASK
72a, 72b CENTER REGION
74a, 74b PERIPHERAL REGION
90a, 90b ION BEAM

The invention claimed is:

1. A method for manufacturing a piezoelectric vibration element, the method comprising:
preparing a piezoelectric substrate having a first main surface and a second main surface opposing the first main surface;
providing a first electrode layer on the first main surface of the piezoelectric substrate;
arranging a mask on a side of the first main surface of the piezoelectric substrate, wherein the mask includes a center region and a peripheral region located along a periphery of the center region; and
irradiating a radiation beam through the mask toward the first main surface of the piezoelectric substrate such that a larger amount of the radiation beam passes through the peripheral region than the center region of the mask so as to remove a part of the first electrode layer to form a first excitation electrode that decreases in thickness from the center region to the peripheral region of the mask on the first main surface of the piezoelectric substrate.

2. The method for manufacturing the piezoelectric vibration element according to claim 1,
wherein the piezoelectric substrate includes a center portion and a peripheral edge portion in a plan view of the first main surface and has a convex shape in which the center portion protrudes more than the peripheral edge portion on the side of the first main surface, and
the first excitation electrode decreases in thickness from a center to a peripheral edge of the center portion of the first main surface.

3. The method for manufacturing the piezoelectric vibration element according to claim 1, wherein the mask is a first mask and the method further comprises:
providing a second electrode layer on the second main surface of the piezoelectric substrate;
arranging a second mask on a side of the second main surface of the piezoelectric substrate, wherein the second mask includes a center region and a peripheral region located along a periphery of the center region; and
irradiating a radiation beam through the second mask toward the second main surface of the piezoelectric substrate such that a larger amount of the radiation beam passes through the peripheral region than the center region of the second mask so as to remove a part of the second electrode layer to form a second excitation electrode that decreases in thickness from the center region to the peripheral region of the second mask on the second main surface of the piezoelectric substrate.

4. The method for manufacturing the piezoelectric vibration element according to claim 3,
wherein the piezoelectric substrate includes a center portion and a peripheral edge portion in a plan view of the second main surface and has a convex shape in which the center portion protrudes more than the peripheral edge portion on the side of the second main surface, and
the second excitation electrode decreases in thickness from a center to a peripheral edge of the center portion of the second main surface.

5. The method for manufacturing the piezoelectric vibration element according to claim 3,
wherein the irradiating with the radiation beam toward the second main surface is performed after the irradiating with the radiation beam toward the first main surface.

6. The method for manufacturing the piezoelectric vibration element according to claim 3,
wherein the irradiating with the radiation beam toward the second main surface is performed at least partially simultaneously with the irradiating with the radiation beam toward the first main surface.

7. The method for manufacturing the piezoelectric vibration element according to claim 3, further comprising adjusting a frequency of the piezoelectric vibration element during at least one of the irradiating with the radiation beam toward the first main surface and the irradiating with the radiation beam toward the second main surface.

8. The method for manufacturing the piezoelectric vibration element according to claim 7, wherein the adjusting of the frequency is conducted by:
measuring an initial frequency of the piezoelectric substrate in a state in which at least one of the first electrode layer and the second electrode layer are provided thereon before the irradiation with the radiation beam;
controlling irradiation conditions of the radiation beams based on the initial frequency so as to control the thicknesses of the first excitation electrode and/or the second excitation electrode.

9. The method for manufacturing the piezoelectric vibration element according to claim 3, further comprising adjusting a frequency of the piezoelectric vibration element during the irradiating with the radiation beam toward the first main surface.

10. The method for manufacturing the piezoelectric vibration element according to claim 9, wherein the adjusting of the frequency is conducted by:
measuring an initial frequency of the piezoelectric substrate in a state in which the first electrode layer is provided thereon before the irradiation with the radiation beam;
controlling irradiation conditions of the radiation beam based on the initial frequency so as to control the thickness of the first excitation electrode.

11. The method for manufacturing the piezoelectric vibration element according to claim 3,
wherein each of the center region and the peripheral region of the first and second masks includes one or more openings through which the radiation beam passes, and
a size of the one or more openings in the peripheral region is larger than a size of the one or more openings in the center region.

12. The method for manufacturing the piezoelectric vibration element according to claim 1,
wherein each of the center region and the peripheral region of the first mask includes one or more openings through which the radiation beam passes, and
a size of the one or more openings in the peripheral region is larger than a size of the one or more openings in the center region.

13. The method for manufacturing the piezoelectric vibration element according to claim 3,
wherein the center region of the first and second masks is constructed to block the radiation beam, and
the peripheral region of the first and second masks defines an opening through which the radiation beam passes.

14. The method for manufacturing the piezoelectric vibration element according to claim 1,
wherein the center region of the first mask is constructed to block the radiation beam, and
the peripheral region of the first mask defines an opening through which the radiation beam passes.

15. The method for manufacturing the piezoelectric vibration element according to claim 1, wherein the piezoelectric substrate is a quartz crystal blank.

16. The method for manufacturing the piezoelectric vibration element according to claim 1, wherein the radiation beam is an ion beam.

17. A method for manufacturing a piezoelectric vibrator, the method comprising:
forming the piezoelectric vibration element according to claim 1;
mounting the piezoelectric vibration element on a base member; and
bonding a lid member to the base member with a bonding member so as to accommodate the piezoelectric vibration element therebetween.

18. The method for manufacturing the piezoelectric vibrator according to claim 17, further comprising:
adjusting a frequency by removing a part of the first excitation electrode after the mounting of the piezoelectric vibration element on the base member.

19. A method for manufacturing a piezoelectric vibrator, the method comprising:
forming the piezoelectric vibration element according to claim 3;
mounting the piezoelectric vibration element on a base member; and
bonding a lid member to the base member with a bonding member so as to accommodate the piezoelectric vibration element therebetween.

20. The method for manufacturing the piezoelectric vibrator according to claim 19, further comprising:
adjusting a frequency by removing a part of at least one of the first excitation electrode and the second excitation electrode after the mounting of the piezoelectric vibration element on the base member.

* * * * *